(12) United States Patent  (10) Patent No.: US 9,018,097 B2
Dyer et al.  (45) Date of Patent: Apr. 28, 2015

(54) SEMICONDUCTOR DEVICE PROCESSING WITH REDUCED WIRING PUDDLE FORMATION

(71) Applicant: International Business Machines Corporation, Armonk, NY (US)

(72) Inventors: Thomas W. Dyer, Pleasant Valley, NY (US); Hanako Henry, Newburgh, NY (US); Tze-Man Ko, Hopewell Junction, NY (US); Yiheng Xu, Hopewell Junction, NY (US); Shaoning Yao, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 13/648,329

(22) Filed: Oct. 10, 2012

(65) Prior Publication Data

US 2014/0099787 A1   Apr. 10, 2014

(51) Int. Cl.
*H01L 21/302*  (2006.01)
*H01L 21/768*  (2006.01)

(52) U.S. Cl.
CPC .................. *H01L 21/76801* (2013.01)

(58) Field of Classification Search
CPC ............. H01L 21/76807; H01L 21/76808; H01L 21/76801
USPC ............ 438/689, 697, 699; 257/E21.641, 257/E21.49
See application file for complete search history.

(56) References Cited

U.S. PATENT DOCUMENTS

| 5,444,026 | A   |   | 8/1995  | Kim et al. |
|-----------|-----|---|---------|------------|
| 6,730,454 | B2  |   | 5/2004  | Pfeiffer et al. |
| 6,780,736 | B1  |   | 8/2004  | Holmes et al. |
| 6,927,015 | B2  |   | 8/2005  | Khojasteh et al. |
| 7,786,017 | B1  |   | 8/2010  | Morgenfeld et al. |
| 7,977,237 | B2  |   | 7/2011  | Feustel et al. |
| 8,093,150 | B2  |   | 1/2012  | Beck et al. |
| 8,105,942 | B2  |   | 1/2012  | Choi et al. |
| 8,288,271 | B2  | * | 10/2012 | Akinmade Yusuff et al. 438/636 |
| 2008/0064163 | A1 | * | 3/2008 | Coolbaugh et al. ........... 438/253 |
| 2009/0079077 | A1 | * | 3/2009 | Yang et al. ..................... 257/751 |
| 2009/0283912 | A1 | * | 11/2009 | Akinmade-Yusuff et al. ............................. 257/758 |
| 2010/0181678 | A1 | * | 7/2010 | Edelstein et al. ............. 257/773 |
| 2011/0092069 | A1 | * | 4/2011 | Cheng et al. .................. 438/672 |
| 2011/0111596 | A1 | * | 5/2011 | Kanakasabapathy ......... 438/694 |
| 2011/0291196 | A1 |   | 12/2011 | Wei et al. |

OTHER PUBLICATIONS

Nitin R. Kamat et al., "A Study of Defects Causing Yield Loss in Copper Backend Process Due to the Power Shorts," Proceedings of the 12th International Symposium on Physical and Failure Analysis of Integrated Circuits, 2005. IPFA 2005, Jun. 27-Jul. 1, 2005, pp. 271-274.

* cited by examiner

*Primary Examiner* — Julia Slutsker
(74) *Attorney, Agent, or Firm* — Cantor Colburn LLP; Catherine Ivers

(57) ABSTRACT

A method of forming an interconnect structure for a semiconductor device includes forming a lower antireflective coating layer over a dielectric layer; forming an organic planarizing layer on the lower antireflective coating layer; transferring a wiring pattern through the organic planarizing layer; transferring the wiring pattern through the lower antireflective coating layer; and transferring the wiring pattern through the dielectric layer, wherein unpatterned portions of the lower antireflective coating layer serve as an etch stop layer so as to prevent any bubble defects present in the organic planarizing layer from being transferred to the dielectric layer.

13 Claims, 8 Drawing Sheets

SEMICONDUCTOR DEVICE PROCESSING WITH REDUCED WIRING PUDDLE FORMATION

BACKGROUND

The present disclosure relates generally to semiconductor device manufacturing techniques and, more particularly, to the elimination of puddles in semiconductor device wiring due to bubble formation in optical planarization layers.

In the manufacture of semiconductor devices, processing operations generally fall under two main categories. Specifically, "front end of the line" (FEOL) processing is dedicated to the formation of active devices such as transistors in the body or substrate of the semiconductor device, whereas "back end of the line" (BEOL) processing involves the formation of metal interconnect structures, which connect all the active devices with each other as well as with the external world. The FEOL consists of a repeated sequence of steps that modifies the electrical properties of part of a wafer surface and forms new material(s) above selected regions. Once all active components are created, the upper phase of manufacturing (BEOL) begins. During the BEOL, metal interconnects are created to establish the connection pattern of the semiconductor device.

As feature sizes continue to scale down in semiconductor industry, the fabrication process of integrated circuit devices becomes more and more complex. Advanced semiconductor designs typically incorporate multilayer structures. For example, during the process of formation of a metal interconnect, usually a hardmask layer, a planarization layer and an antireflective coating (ARC) layer are sequentially formed on a substrate with a dielectric layer thereon. A photoresist layer is then formed on top of the ARC layer. The definition of the pattern is formed by photolithography on the photoresist layer. The resist pattern is transferred to the ARC layer via an etch process using the photoresist film as a mask. Similarly, the ARC pattern is transferred sequentially through all other underlying layers, and finally, a pattern is formed on the substrate.

SUMMARY

In an exemplary embodiment, a method of forming an interconnect structure for a semiconductor device includes forming a lower antireflective coating layer over a dielectric layer; forming an organic planarizing layer on the lower antireflective coating layer; transferring a wiring pattern through the organic planarizing layer; transferring the wiring pattern through the lower antireflective coating layer; and transferring the wiring pattern through the dielectric layer, wherein unpatterned portions of the lower antireflective coating layer serve as an etch stop layer so as to prevent any bubble defects present in the organic planarizing layer from being transferred to the dielectric layer.

In another embodiment, a method of forming an interconnect structure for a semiconductor device includes forming an interlevel dielectric layer on a dielectric capping layer; forming a hardmask layer on the interlevel dielectric layer; forming a lower antireflective coating layer on the hardmask layer; forming an organic planarizing layer on the lower antireflective coating layer; forming an upper antireflective coating layer on the organic planarizing layer; forming a photoresist layer on the upper antireflective coating layer; defining a wiring pattern in the photoresist layer; transferring a wiring pattern through the upper antireflective coating layer and the organic planarizing layer; transferring the wiring pattern through the lower antireflective coating layer; transferring the wiring pattern through the hardmask layer and the interlevel dielectric layer, wherein unpatterned portions of the lower antireflective coating layer serve as an etch stop layer so as to prevent any bubble defects present in the organic planarizing layer from being transferred to the interlevel dielectric layer; transferring the wiring pattern through the dielectric capping layer; and filling openings defined by the transferred wiring pattern so as to form wiring structures within the interlevel dielectric layer.

BRIEF DESCRIPTION OF THE SEVERAL VIEWS OF THE DRAWINGS

Referring to the exemplary drawings wherein like elements are numbered alike in the several Figures:

FIGS. 1 through 6 are a series of cross sectional views illustrating the formation of a wiring layer where one or more bubbles are present within an OPL layer, in which:

FIG. 1 illustrates a patterned resist layer over an AR coating layer and an OPL layer having a bubble formation therein;

FIG. 2 illustrates the transfer of the wiring pattern in the resist layer through the AR and OPL layers;

FIG. 3 illustrates the transfer of the wiring pattern through a hardmask layer and into a dielectric layer;

FIG. 4 illustrates the transfer of the wiring pattern through the dielectric layer down to another dielectric capping layer, wherein the bubble formation is caused to be transferred through the hardmask layer and into the dielectric layer;

FIG. 5 illustrates the transfer of the wiring pattern through the dielectric etch stop layer;

FIG. 6 illustrates metal filling and polishing of the wiring pattern, which also results in the formation of a wiring puddle;

FIGS. 11 through 16 are a series of cross sectional views illustrating a method of eliminating wiring puddle formation in semiconductor devices in accordance with an exemplary embodiment, in which:

FIG. 11 illustrates a patterned resist layer over a lower AR coating layer and an OPL layer having a bubble formation therein;

FIG. 12 illustrates the transfer of the wiring pattern in the resist layer through the lower AR coating layer and OPL layer;

FIG. 13 illustrates the transfer of the wiring pattern through an upper AR coating layer formed on the hardmask layer;

FIG. 14 illustrates the transfer of the wiring pattern through the hardmask layer and the dielectric layer down to another dielectric capping layer, wherein the bubble formation is prevented from being transferred through the hardmask layer and into the dielectric layer;

FIG. 15 illustrates the transfer of the wiring pattern through the dielectric capping layer; and FIG. 16 illustrates metal filling and polishing of the wiring pattern, without the formation of a wiring puddle due to OPL bubble transfer.

DETAILED DESCRIPTION

With respect to the use of optical planarization layers and antireflective coating layers in the BEOL, certain shorting defects have been discovered due to the formation of small "puddles" (e.g., <50 nanometers) in the wiring levels. It is suspected that bubbles or voids present in the OPL material result in the voids being transferred through hardmask and dielectric layers during etching, which voids in turn are filled by the wiring metal material. In addition to shorting failures, puddles may also contribute to time dependent dielectric breakdown (TDDB) extrinsic failures. Unfortunately, changes to the OPL material or modifications to the device surfaces do not completely eliminate pinhole puddle formations. Moreover, such puddle formations are difficult to detect through analysis of process limiting yield (PLY) data, i.e., photo inspections.

Referring initially to FIGS. 1 through 6, there are shown a series of cross sectional views illustrating the formation of a wiring layer where one or more bubbles are present within an OPL layer. As particularly illustrated in FIG. 1, a semiconductor structure 100 includes a dielectric capping layer 102, such as NBlok (Si—C—N—H), which is formed over a lower layer (not specifically shown). It should be appreciated that the structure 100 depicted in FIG. 1 may represent any level of wiring (e.g., M1, M2, etc.) in a semiconductor device. The capping layer may, for example, prevent diffusion of a metal lower layer of the structure into higher levels. An interlevel dielectric (ILD) layer 104 in which the wiring is to be formed is disposed over the dielectric capping layer 102. The ILD layer 104 may include, for example, an oxide material, a nitride material, a low-K material such as SiCOH, or other suitable dielectric materials known in the art.

Figure 1:
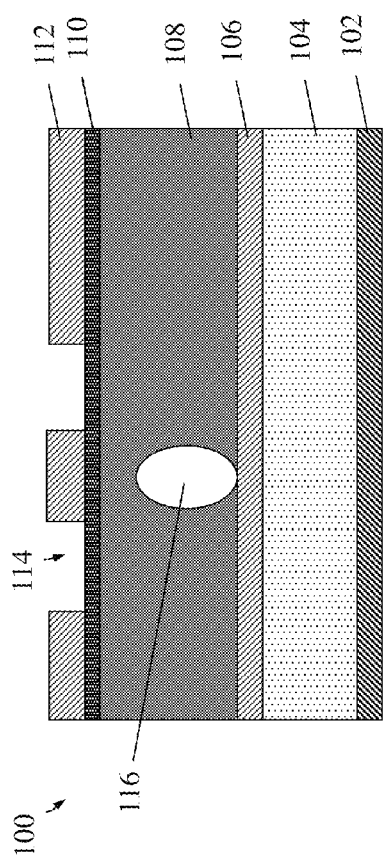

Disposed over the ILD layer 104 are, in succession, a hardmask layer 106 such as TEOS (tetraethyl orthosilicate), an optical planarizing layer 108, an AR coating layer 110 (e.g., silicon ARC or SiARC), and a photoresist layer 112. As illustrated in FIG. 1, the photoresist layer 112 is patterned with openings 114 corresponding to desired wiring locations within the ILD layer 104. As mentioned above, the formation of an OPL such as layer 108 (e.g., by a spin-on technique) may result in the presence of one or more bubbles 116 therein.

Figure 2:
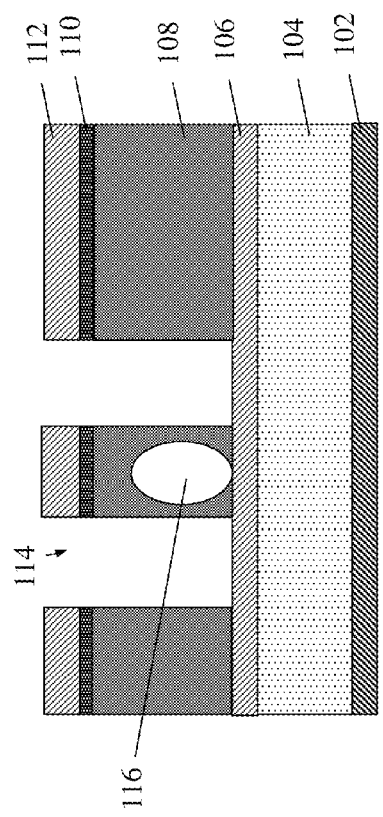
Figure 3:
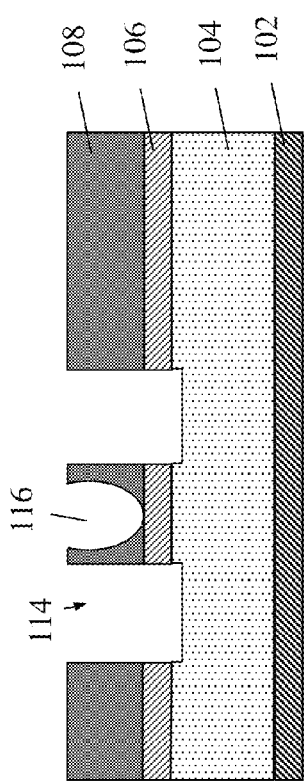

In FIG. 2, the wiring pattern defined by the openings 114 is transferred through the SiARC layer 110 and through the OPL 108. As then shown in FIG. 3, the wiring pattern is further transferred through the hardmask layer 106 and into the ILD layer 104. Notably, the resist layer has been consumed at this point, as well as remaining portions of the SiARC layer 110 and a top surface of the OPL 108.

Figure 4:
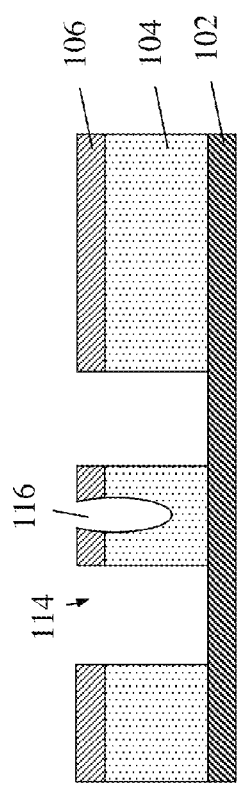

Proceeding to FIG. 4, a main etch (ME) process is then used to define the wiring pattern through the ILD layer 104, stopping on the dielectric capping layer 102. The etching may continue for a period of time, i.e., an over etch (OE) into the dielectric capping layer 102 to ensure the wiring pattern has been transferred completely through the ILD layer 104. It will be noted, however, that the pattern of the bubble 116 has now also been transferred through the hardmask layer 106 and into the ILD layer 104, thereby defining a pinhole therein.

Figure 5:
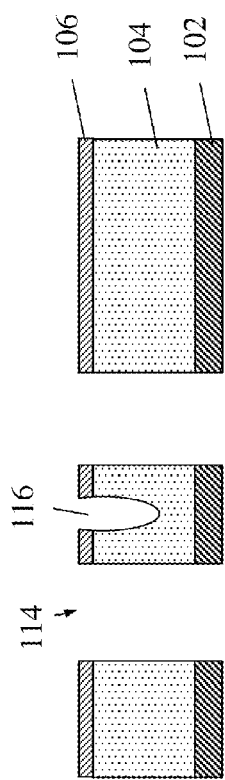
Figure 6:
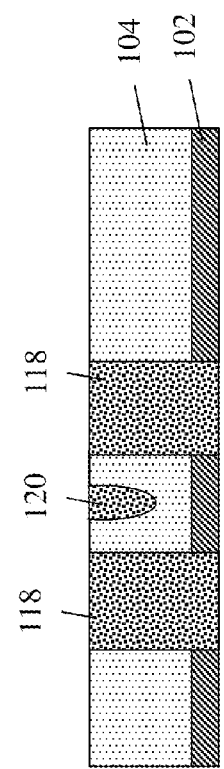

In FIG. 5, the dielectric capping layer 102 is opened to expose the lower wiring level (not specifically shown) thereebeneath. An NBlok etch may also reduce the thickness of the remaining portions of the hardmask layer 106. The structure is now readied for metal fill and polish as known in the art. FIG. 6 illustrates metal deposition (e.g., copper), followed by a planarization such as chemical mechanical polishing (CMP) to form wiring lines 118. However, because of the presence of the undesired pinhole also formed in the ILD layer 104, metallization also results in the formation of a puddle 120 between the wiring lines 118.

Figure 8:
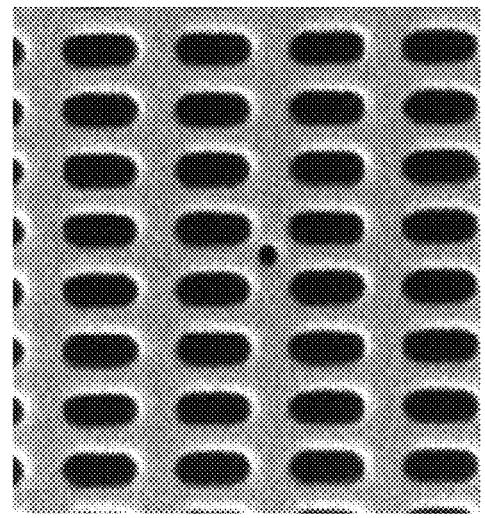
FIG. 8 is another SEM image illustrating a pinhole formation in a patterned dielectric layer.
Figure 7:
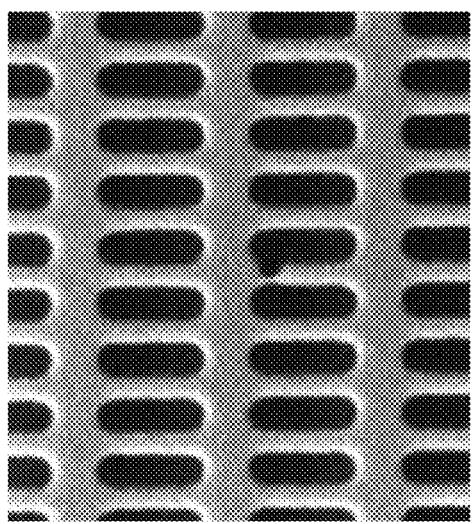
FIG. 7 is a scanning electron micrograph (SEM) image illustrating a pinhole formation in a patterned dielectric layer.
Figure 10:
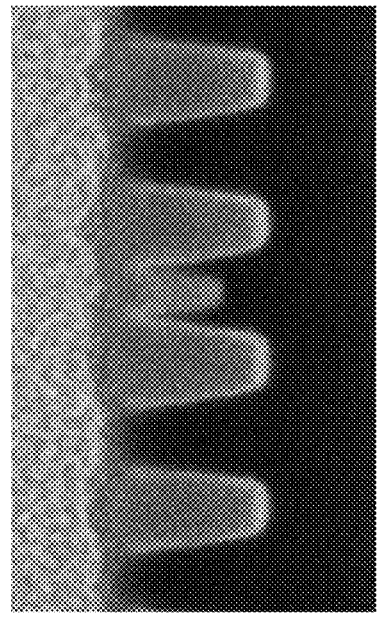
FIG. 10 is an SEM image illustrating a cross sectional view of a puddle defect formed between adjacent wiring lines.

Examples of the defects described above are illustrated in the SEM images of FIGS. 7-10. In FIG. 7, a semicircular pinhole is merged adjacent an oval shaped trench in a dielectric layer. The pinhole very nearly eliminates dielectric material between adjacent trenches, which in turn can lead to a short circuit condition. In FIG. 8, a circular pinhole is clearly defined between four adjacent oval trenches.

Figure 9:
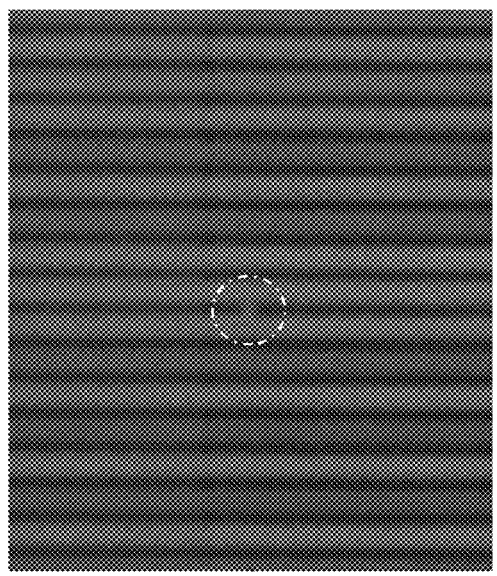
FIG. 9 is an SEM image illustrating a top view of a puddle defect formed between adjacent wiring lines.
Figure 11:
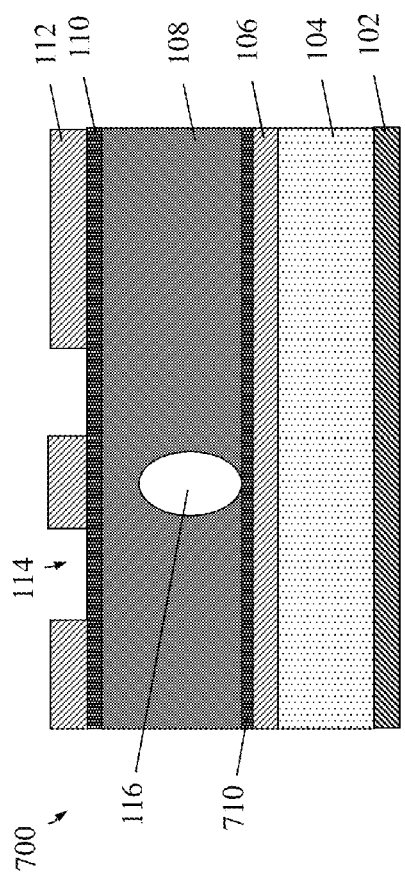

In the SEM of FIG. 9, the dashed circled region illustrates the formation of a puddle disposed between adjacent wiring lines, which puddles appear to create a short circuit condition. Another example of a puddle formation is depicted in the cross sectional image of FIG. 10, where a shallower puddle is disposed between adjacent deeper wiring lines.

Accordingly, in order to overcome the presence of defects as described above, FIGS. 11 through 16 are a series of cross sectional views illustrating a method of eliminating wiring puddle formation in semiconductor devices in accordance with an exemplary embodiment. For ease of description, like elements from previous figures are designated with the same reference numerals.

In comparison with the semiconductor structure 100 of FIG. 1, the semiconductor structure 700 of FIG. 1 additionally provides a lower SiARC layer 710 disposed between the TEOS hardmask layer 106 and the OPL 108. As will be seen, this lower SiARC layer 710 prevents the transfer of any bubbles or voids that may be present in the OPL into the ILD layer 104 in which wiring is formed. Thereby, during metal filling, the formation of shallow metal puddles is prevented. In an exemplary embodiment, the upper SiARC layer 110 layer over the OPL 108 has a thickness that is equal to or greater than that of the lower SiARC layer 710.

Figure 12:
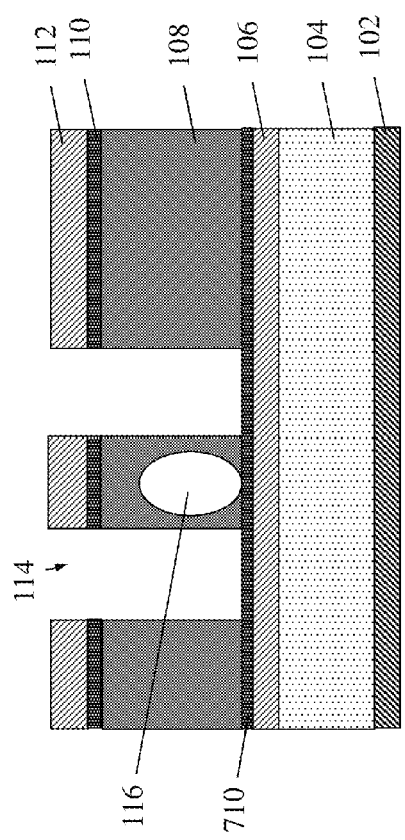
Figure 13:
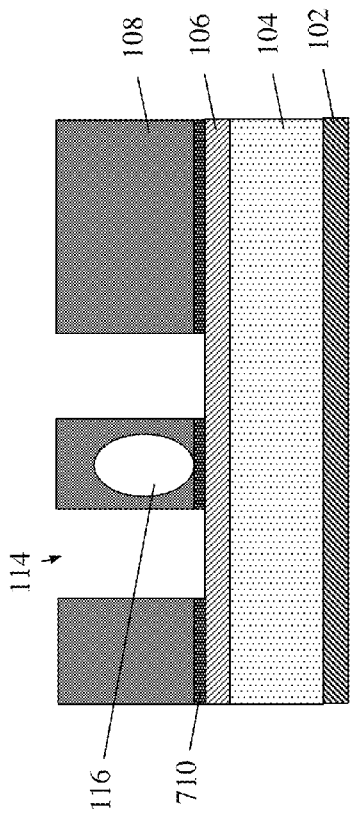

As shown in FIG. 12, the wiring pattern defined by the openings 114 is transferred through the upper SiARC layer 110 and through the OPL 108. Suitable etch chemistries in this regard may include carbon tetrafluoride ($CF_4$), carbon tetrafluoride/fluoroform ($CF_4/CHF_3$), or carbon tetrafluoride/octafluorocyclobutane ($CF_4/C_4F_8$) to etch the SiARC layer 110 selective to the OPL 108. This is followed by etching of the OPL 108 with one or more of $H_2/N_2$, and $CO/N_2$, selective to SiARC, thereby allowing the OPL etching to stop on the lower SiARC layer 710. Then, in FIG. 13, the wiring pattern is transferred through the lower SiARC layer 710 with an etch chemistry (e.g., $CF_4$) that is selective to both the OPL 108 and the TEOS hardmask 106. Once the resist layer 112 is removed, exposure of the upper SiARC layer 110 leaves it vulnerable to removal as the lower SiARC layer 710 is etched.

Figure 14:
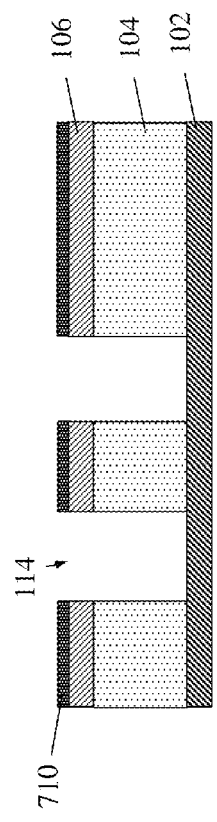

Another etch chemistry is then employed in order to transfer the wiring pattern through the TEOS hardmask layer 106. One suitable example is $C_4F_8/Ar/O_2$, which may also result in slight etching of a top portion of the OPL 108. After etching through the TEOS hardmask layer 106, an ILD etch is implemented to transfer the pattern through the ILD layer 104. For example, using a SiCOH ILD layer 104, a $C_4F_8/Ar/N_2$ or $C_4F_6/Ar/N_2$, selective to SiARC, may be employed. Therefore, even if some OPL material is also removed during hardmask layer removal, the presence of the lower SiARC layer 710 prevents any bubble formation from being transferred through unpatterned hardmask and ILD regions. The resulting wiring pattern transfer though the TEOS hardmask layer 106 and ILD layer 104 is illustrated in FIG. 14.

Figure 15:
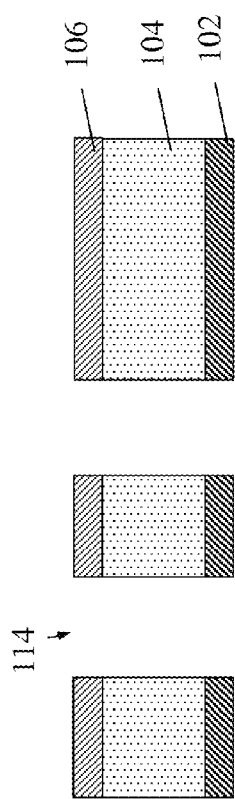
Figure 16:
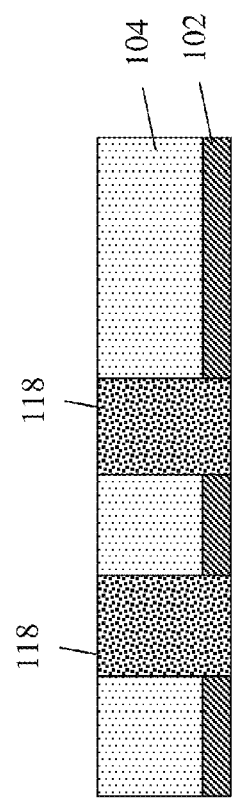

Following the main etch (and possible over etch) of the ILD layer 104, an ashing process may optionally be performed to remove any residues, using a chemistry selective to the lower SiARC layer 710, such as $CO_2$ or $CO_2/CO$ for example. Then, as shown in FIG. 15, the wiring pattern is transferred through the dielectric capping layer 102. An exemplary Nblok etch chemistry may include $CF_4/CO_2$, or $CF_4/CHF_3$, which is not selective to SiARC. Thus, the transfer of the wiring pattern through the dielectric capping layer 102 also results in the removal of remaining portions of the lower SiARC layer 710. Finally, FIG. 16 illustrates metal filling and polishing of the structure so as to form wiring lines 118, but without the formation of a wiring puddle due to OPL bubble transfer. From this point, additional processing as known in the art may continue. It will be appreciated, however, that the above processing operations may be repeated as desired, where planarizing layers are used in different wiring levels, to avoid problems associated with bubble defects present in the OPL.

While the disclosure has been described with reference to an exemplary embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

The invention claimed is:

1. A method of forming an interconnect structure for a semiconductor device, the method comprising:
   forming a lower antireflective coating layer over a dielectric layer;
   forming an organic planarizing layer on the lower antireflective coating layer;
   transferring a wiring pattern through the organic planarizing layer;
   forming an upper antireflective coating layer over the organic planarizing layer;
   transferring the wiring pattern through the lower antireflective coating layer; and
   transferring the wiring pattern through the dielectric layer, wherein unpatterned portions of the lower antireflective coating layer serve as an etch stop layer so as to prevent any bubble defects present in the organic planarizing layer from being transferred to the dielectric layer;
   wherein transferring the wiring pattern through the upper antireflective coating layer and the organic planarizing layer comprises:
   applying one or more of a carbon tetrafluoride ($CF_4$), carbon tetrafluoride/fluoroform ($CF_4/CHF_3$), or carbon tetrafluoride/octafluorocyclobutane ($CF_4/C_4F_8$) etch chemistry to etch the upper antireflective coating layer selective to the organic planarizing layer; and
   applying one or more of an $H_2/N_2$, and a $CO/N_2$ etch chemistry, selective to the lower antireflective coating layer, thereby causing the organic planarizing layer etching to stop on the lower antireflective coating layer.

2. The method of claim 1, further comprising forming a hardmask layer on the dielectric layer and forming the lower antireflective coating layer on the hardmask layer.

3. The method of claim 1, wherein the upper antireflective coating layer has a thickness that is equal to or greater than that of the lower antireflective coating layer.

4. The method of claim 1, wherein the lower antireflective coating layer comprises a silicon antireflective coating (SiARC) layer.

5. The method of claim 1, wherein the dielectric layer comprises SiCOH.

6. A method of forming an interconnect structure for a semiconductor device, the method comprising:
   forming an interlevel dielectric layer on a dielectric capping layer;
   forming a hardmask layer on the interlevel dielectric layer;
   forming a lower antireflective coating layer on the hardmask layer;
   forming an organic planarizing layer on the lower antireflective coating layer;
   forming an upper antireflective coating layer on the organic planarizing layer;
   forming a photoresist layer on the upper antireflective coating layer;
   defining a wiring pattern in the photoresist layer;
   transferring a wiring pattern through the upper antireflective coating layer and the organic planarizing layer;
   transferring the wiring pattern through the lower antireflective coating layer;
   transferring the wiring pattern through the hardmask layer and the interlevel dielectric layer, wherein unpatterned portions of the lower antireflective coating layer serve as an etch stop layer so as to prevent any bubble defects present in the organic planarizing layer from being transferred to the interlevel dielectric layer;
   transferring the wiring pattern through the dielectric capping layer; and
   filling openings defined by the transferred wiring pattern so as to form wiring structures within the interlevel dielectric layer;
   wherein transferring the wiring pattern through the upper antireflective coating layer and the organic planarizing layer comprises:
   applying one or more of a carbon tetrafluoride ($CF_4$), carbon tetrafluoride/fluoroform ($CF_4/CHF_3$), or carbon tetrafluoride/octafluorocyclobutane ($CF_4/C_4F_8$) etch chemistry to etch the upper antireflective coating layer selective to the organic planarizing layer; and
   applying one or more of an $H_2/N_2$, and a $CO/N_2$ etch chemistry, selective to the lower antireflective coating layer, thereby causing the organic planarizing layer etching to stop on the lower antireflective coating layer.

7. The method of claim 6, wherein the upper antireflective coating layer has a thickness that is equal to or greater than that of the lower antireflective coating layer.

8. A method of forming an interconnect structure for a semiconductor device, the method comprising:
   forming a SiCOH interlevel dielectric layer on an NBlok (Si—C—N—H) dielectric capping layer;
   forming a TEOS (tetraethyl orthosilicate) hardmask layer on the interlevel dielectric layer;
   forming a lower antireflective coating layer on the hardmask layer, the lower antireflective coating layer comprising a silicon antireflective coating (SiARC) layer;
   forming an organic planarizing layer on the lower antireflective coating layer;
   forming an upper antireflective coating layer on the organic planarizing layer, also comprising an SiARC layer, wherein the upper antireflective coating layer has a thickness that is equal to or greater than that of the lower antireflective coating layer;
   forming a photoresist layer on the upper antireflective coating layer;
   defining a wiring pattern in the photoresist layer;
   transferring a wiring pattern through the upper antireflective coating layer and the organic planarizing layer;
   transferring the wiring pattern through the lower antireflective coating layer;
   transferring the wiring pattern through the hardmask layer and the interlevel dielectric layer, wherein unpatterned portions of the lower antireflective coating layer serve as an etch stop layer so as to prevent any bubble defects present in the organic planarizing layer from being transferred to the interlevel dielectric layer;

transferring the wiring pattern through the dielectric capping layer; and filling openings defined by the transferred wiring pattern so as to form wiring structures within the interlevel dielectric layer;

wherein transferring the wiring pattern through the upper antireflective coating layer and the organic planarizing layer comprises:

applying one or more of a carbon tetrafluoride ($CF_4$), carbon tetrafluoride/fluoroform ($CF_4/CHF_3$), or carbon tetrafluoride/octafluorocyclobutane ($CF_4/C_4F_8$) etch chemistry to etch the upper antireflective coating layer selective to the organic planarizing layer; and applying one or more of an $H_2/N_2$, and a $CO/N_2$ etch chemistry, selective to the lower antireflective coating layer, thereby causing the organic planarizing layer etching to stop on the lower antireflective coating layer.

9. The method of claim 8, wherein transferring the wiring pattern through the lower antireflective coating layer comprises applying a $CF_4$ etch chemistry that is selective to both the lower antireflective coating layer and the hardmask layer.

10. The method of claim 9, wherein transferring the wiring pattern through the hardmask layer comprises applying a $C_4F_8/Ar/O_2$ etch chemistry.

11. The method of claim 10, wherein the $C_4F_8/Ar/O_2$ etch chemistry also etches of a top portion of the organic planarizing layer.

12. The method of claim 11, wherein transferring the wiring pattern through the interlevel dielectric layer comprises applying one or more of a $C_4F_8/Ar/N_2$ or a $C_4F_6/Ar/N_2$ etch chemistry, selective to the lower antireflective coating layer.

13. The method of claim 12, wherein transferring the wiring through the dielectric capping layer comprises applying one or more of a $CF_4/CO_2$ or a $CF_4/CHF_3$ etch chemistry, which is not selective to the lower antireflective coating layer.

* * * * *